US012729424B2

(12) United States Patent
Boschker et al.

(10) Patent No.: US 12,729,424 B2
(45) Date of Patent: Sep. 8, 2026

(54) LASER SYSTEM AND EVAPORATION SYSTEM

(71) Applicant: MAX-PLANCK-GESELLSCHAFT ZUR FÖRDERUNG DER WISSENSCHAFTEN E.V., Munich (DE)

(72) Inventors: Johannes Arnoldus Boschker, Stuttgart (DE); Wolfgang Braun, Bietigheim-Bissingen (DE)

(73) Assignee: Max-Planck-Gesellschaft zur Förderung der Wissenschaften e. V., Munich (DE)

( * ) Notice: Subject to any disclaimer, the term of this patent is extended or adjusted under 35 U.S.C. 154(b) by 0 days.

(21) Appl. No.: 18/871,656

(22) PCT Filed: Jun. 15, 2022

(86) PCT No.: PCT/EP2022/066393
§ 371 (c)(1),
(2) Date: Dec. 4, 2024

(87) PCT Pub. No.: WO2023/241795
PCT Pub. Date: Dec. 21, 2023

(65) Prior Publication Data

US 2026/0152843 A1 Jun. 4, 2026

(51) Int. Cl.
*C23C 14/28* (2006.01)
*B23K 26/064* (2014.01)
(Continued)

(52) U.S. Cl.
CPC .......... *C23C 14/28* (2013.01); *B23K 26/0643* (2013.01); *B23K 26/703* (2015.10); *C23C 14/542* (2013.01)

(58) Field of Classification Search
CPC ... C23C 14/28; C23C 14/542; B23K 26/0643; B23K 26/703
See application file for complete search history.

(56) References Cited

U.S. PATENT DOCUMENTS 5,227,608 A * 7/1993 Yoshida ................ B23K 26/16 219/121.84
7,102,118 B2 9/2006 Acker et al.
(Continued)

FOREIGN PATENT DOCUMENTS

WO 2016/102757 A1 6/2016
WO 2020/212398 A2 10/2020

*Primary Examiner* — Seung C Sohn
(74) *Attorney, Agent, or Firm* — Dickinson Wright PLLC

(57) ABSTRACT

The present invention relates to a laser system (10) for evaporating and/or sublimating a material (124) of a source (120) located in a reaction chamber (110) of an evaporation system (100), the laser system (10) comprising a laser light source (12) for providing a laser beam (16) and a guidance means (14) for guiding the laser beam (16) towards an initial spot (20) on a surface (122) of the source (120). In addition, the invention relates to an evaporation system (100) for coating a substrate (130) with evaporated and/or sublimated material (124) of a source (120), comprising a reaction chamber (110) with a reaction volume (114) for arranging the source (120) and the substrate (130), and a laser system (10) for evaporating and/or sublimating the material (124) of the source (120).

21 Claims, 5 Drawing Sheets

Figure 2:
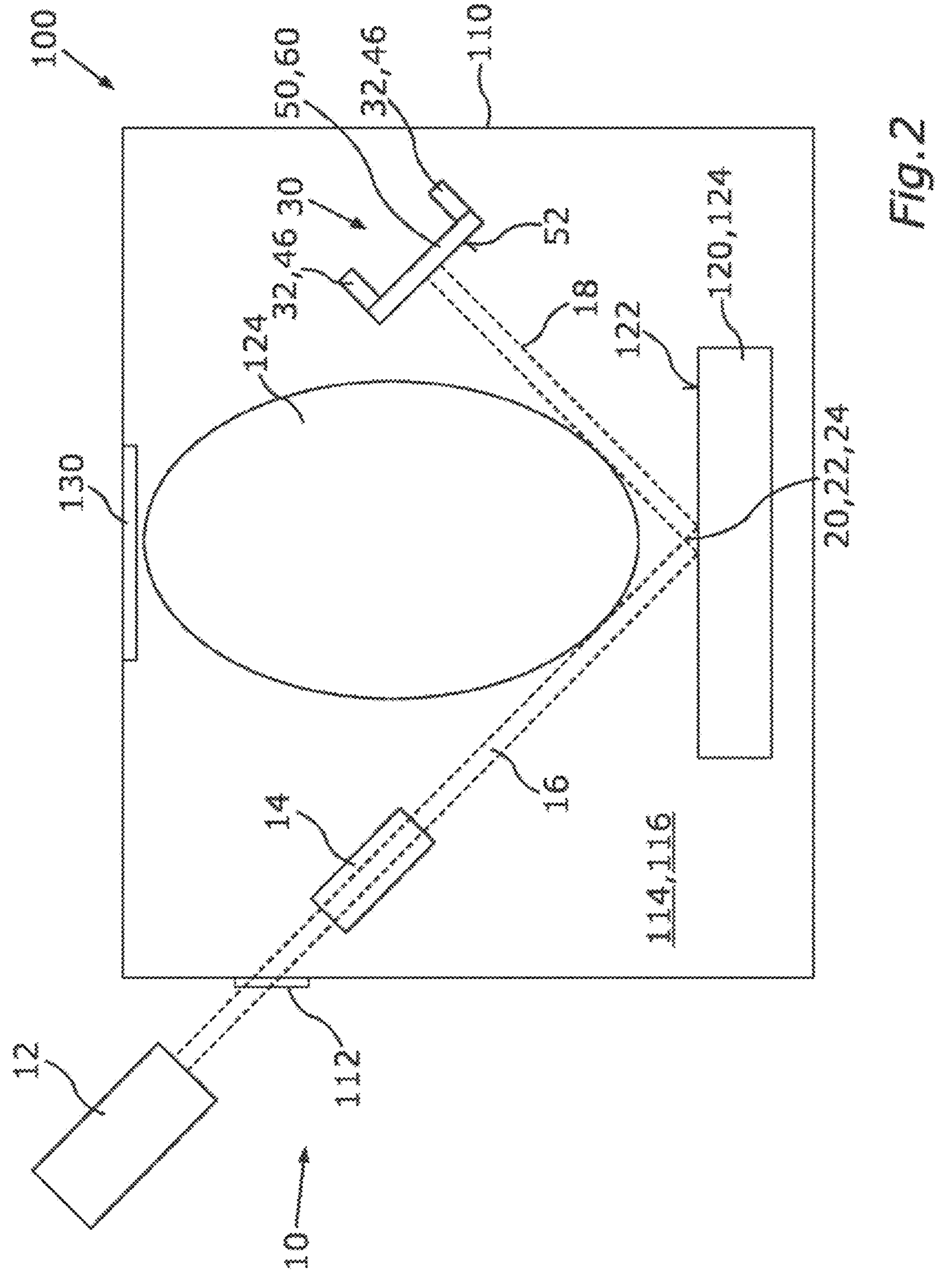

(51) Int. Cl.
*B23K 26/70* (2014.01)
*C23C 14/54* (2006.01)

(56) References Cited

U.S. PATENT DOCUMENTS

2021/0355576 A1 11/2021 Braun et al.
2025/0163565 A1 * 5/2025 Braun .................. C23C 14/564

* cited by examiner

State of the art

Fig. 1

100
110
50,60
32,46
30
32,46
52
124
18
122
120,124
130
20,22,24
14
16
114,116
12
112
10

80,82
110
50,70,72
30
32,46
52
50,70,74
18
32,46
18
52
120,122
114,116
20,22,24
52
18
52
50,70,74
50,70,72
32,46
32,46
16
12
100
10

44
44
40
40
110
42
42
114,116

38
B)
30
56
42
42
34,36
34,36
40
42
40
40
50,60,72,74
54
52
18
124
A)

LASER SYSTEM AND EVAPORATION SYSTEM

CROSS-REFERENCES TO RELATED APPLICATIONS

This application is a 371 National Phase Application of International Application PCT/EP2022/066393, filed on Jun. 15, 2022. The entire disclosure of the application referenced above is incorporated herein by reference.

The invention relates to a laser system for evaporating and/or sublimating a material of a source located in a reaction chamber of an evaporation system, the laser system comprising a laser light source for providing a laser beam and a guidance means for guiding the laser beam towards an initial spot on a surface of the source. In addition, the invention relates to an evaporation system for coating a substrate with evaporated and/or sublimated material of a source, comprising a reaction chamber with a reaction volume for arranging the source and the substrate, and a laser system for evaporating and/or sublimating the material of the source.

In the field of evaporation systems, laser evaporation has several advantages compared to other forms of evaporation. Laser light sources can provide arbitrarily high power densities and hence extremely high temperatures can be reached. Therefore, the evaporation of materials with low vapor pressures is possible. Further, laser light does not react with background gasses. Therefore, laser evaporation is suitable to a wide range of atmospheres and chemistries. The excellent control provided by the laser power input results in stable deposition processes. Finally, the laser evaporation process does not involve charged particles and does not generate x-rays, therefore specimen damage is minimized.

Figure 1:
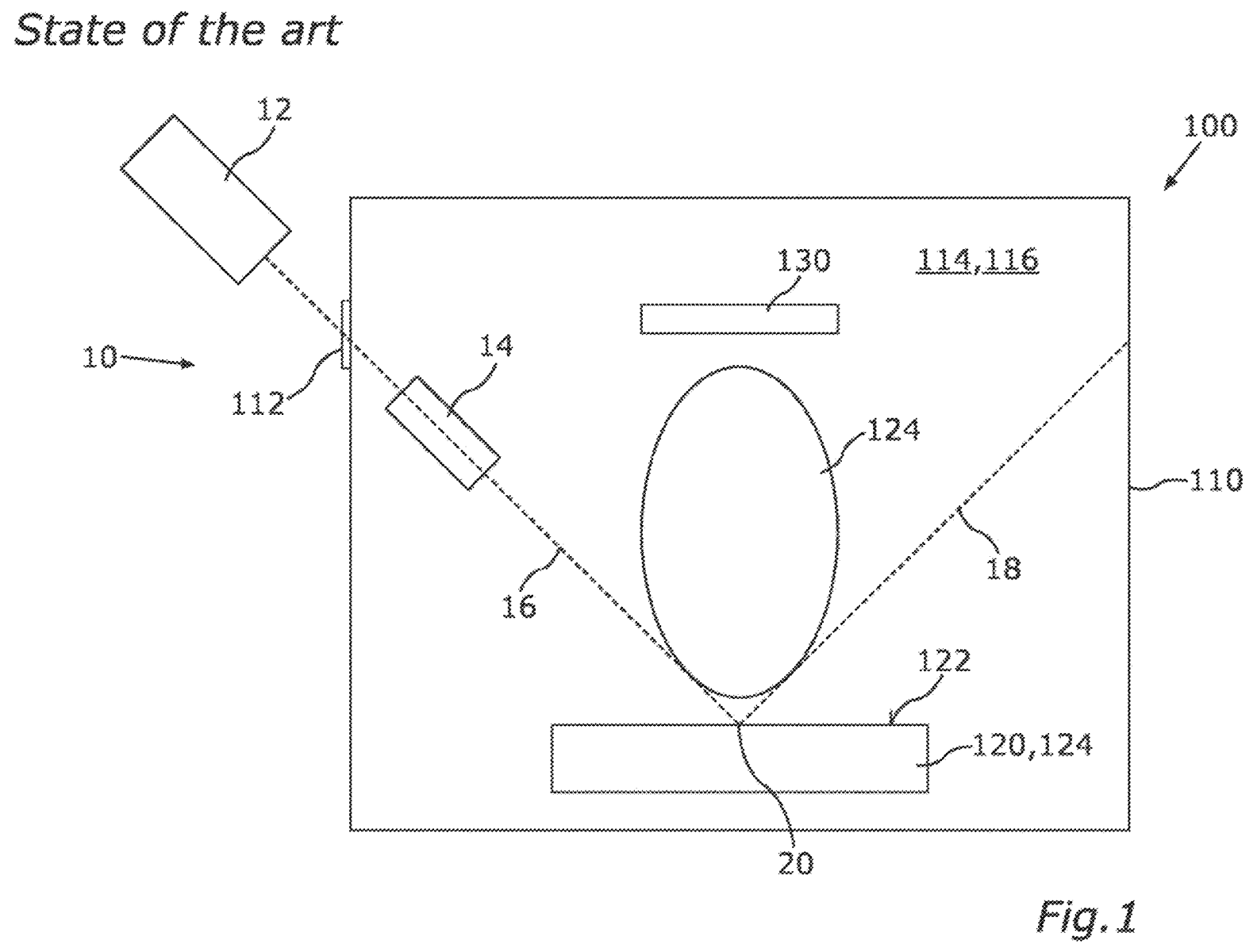

A simplified example of such an evaporation system 100 with a laser system 10 of the state of the art is depicted in FIG. 1. A source 120 providing the material 124 to be evaporated is arranged within the reaction chamber 110, likewise a substrate 130 to be coated. The reaction chamber 110 encompasses a reaction volume 114 filled with a reaction atmosphere 116 suitable for the intended coating of the substrate 130. The evaporated and/or sublimated material 124 of the source 120, in some cases after a reaction with the reaction atmosphere 116, is deposited onto the substrate 130. A laser light source 12 provides a laser beam 16, which enters a reaction chamber 110 of the evaporation system 100 through a chamber window 112. Guidance means 14 align the laser beam 16 towards an initial spot 20 on the surface 122 of the target 120. Evaporated and/or sublimated material 124, depicted as elliptical cloud, emerges from the source 120 towards the substrate 130.

However, most materials 124 to be evaporated do not have perfect optical absorption for the laser beams 16 with frequencies providable by the used high-power laser light sources 12. Typically, the reflectivity is between 50 and 90%. This implies a significant part of the power of the laser beam 16 is not used for the evaporation of the material 124, but is reflected on the surface 122 of the source 120 into a reflected laser beam 18. Hence, only a fraction of the power of the provided laser beam 16 is actually used for the evaporation and/or sublimation process. In addition, especially for large-scale evaporation, the energy efficiency of the process is critical. This is because all energy that is not used to evaporate material 124 needs to be managed as well. This is costly and can deteriorate the coating process.

In view of the above, it is an object of the present invention to provide an improved laser system and an improved evaporation system which do not have the aforementioned drawbacks of the state-of-the-art. In particular it is an object of the present invention to provide an improved laser system and an improved evaporation system which allow lowering the fraction of unused laser power and thereby raising the general efficiency of the laser system and the evaporation system, respectively.

This object is satisfied by the respective independent patent claims. In particular, this object is satisfied by a laser system according to claim 1 and by an evaporation system according to claim 21. The dependent claims describe preferred embodiments of the invention. Details and advantages described with respect to a laser system according to the first aspect of the invention also refer to an evaporation system according to the second aspect of the invention and vice versa, if of technical sense.

According to the first aspect of the invention, the object is satisfied by a laser system for evaporating and/or sublimating a material of a source located in a reaction chamber of an evaporation system, the laser system comprising a laser light source for providing a laser beam and a guidance means for guiding the laser beam towards an initial spot on a surface of the source. The laser system according to the present invention is characterized in that the laser system comprises a mirror assembly with one or more mirrors for reflecting a reflected laser beam reflected at the surface of the source back towards the surface of the source.

The laser system according to the present invention is intended and suitable to be used in an evaporation system. In most cases, such an evaporation system comprises a reaction chamber encompassing a reaction volume. In said reaction volume, a source comprising the material to be evaporated and a substrate to be coated can be or already are arranged. Also providing more than one sources or using a source which provides more than one material is possible. In alternative to a vacuum as low as $10^{-10}$ hPa or lower, the reaction volume can be filled with a reaction atmosphere suitable for the composition of the intended coating on the substrate. Possible reaction atmospheres include but are not limited to oxygen, ozone, nitrogen, methane, ammonia, but also sulfuric or selenic gases.

The laser system itself comprises a laser light source for actually providing a laser beam. Normally, the laser light source is arranged outside of the reaction chamber and a coupling means, such as for instance a chamber window, allows to couple the laser beam into the reaction chamber and simultaneously separates the reaction volume from the surroundings. A guidance means is used for guiding the laser beam towards an initial spot on a surface of the source. Said guidance means can for instance comprise mirrors, lenses, beam compressors and/or beam expanders, axicons and/or other suitable optical elements.

According to the present invention, in addition to the guidance means, the laser system comprises a mirror assembly which is arranged within the reaction volume. The mirror assembly comprises one or more mirrors for reflecting laser light, especially laser light corresponding to the laser beam provided by the laser light source. In particular, the one or more mirrors of the mirror assembly are arranged and aligned such that, within the reaction chamber, a laser beam which is reflected at a surface of the source is reflected back again towards the surface of the source.

In other words, the reflected laser beam, which normally is dumped somewhere within the reaction chamber and hence is lost for evaporation and/or sublimation in laser systems and evaporations systems according to the state of the art, can be used at least one more time for evaporating and/or sublimating the material of the source. This recycling of the reflected laser beam lowers the fraction of unused laser power, as at least one additional evaporation and/or sublimation iteration can be established. The general efficiency of the laser system can thereby be enhanced.

For an estimate, we denote P as representing the laser power and R representing the reflectivity on a surface of the material of the source. This is also a good assumption for the surface of the mirror as it will be coated with the evaporated and/or sublimated material during operation. Please note that R is smaller than 1, typically between 0.5 and 0.9. Without the mirror assembly of the present invention, the laser power effectively used for evaporating and/or sublimating the material of the source is $(1-R)*P$. By reflecting back the laser beam onto the source by a single mirror this value already rises to $((1-R)+R*R*(1-R))*P$. If $R=0.9$, this rises the fraction of the used laser power from 0.1 to 0.181. Generally, a higher reflectivity R results in a higher enhancement of the efficiency of the laser system according to the present invention.

In particular, the laser system according to the present invention can comprise that the mirror assembly comprises an arrangement means for arranging the one or more mirrors within the reaction chamber. Said arrangement means can be used for accurately and especially immovably placing the mirrors of the mirror assembly within the reaction chamber. A subsequent shifting or changing of a position of a mirror of the mirror assembly can thus be avoided.

According to an enhanced embodiment, the laser system according to the present invention can comprise that the arrangement means comprise alignment means for changing, preferably actively changing, a direction of the reflected laser beam reflected on the one or more mirrors. In other words, said alignment means can be used to precisely adjust the spot on the surface of the source, on which the laser beam is reflected back by the respective mirror. Preferably, the alignment means can actively change the direction of the reflected laser beam. Actively changing in the scope of the present invention encompasses in particular that the alignment means comprise an actuator for changing a position and/or orientation of the respective mirror. Changing said position and/or orientation of the respective mirror can thereby be provided without opening the reaction chamber. Thereby, also reflecting back the laser beam onto different spots on the surface of the source can be provided within the same, uninterrupted coating process. Preferably, said actuator can also be addressed remotely from outside of the reaction chamber. Thereby also subsequent and/or spontaneous changes of said position and/or orientation of the respective mirror can be provided without opening the reaction chamber.

Further, the laser system according to the present invention can comprise that the mirror assembly comprises one or more individual mirrors for directly reflecting the reflected laser beam reflected on an originating spot on the surface of the source back towards a destination spot on the surface of the source. In other words, the reflected laser beam originating from the surface of the source impinges onto the individual mirror and is directly reflected back towards the source. Hence, only a single individual mirror is required for this purpose, thereby reducing the effort for arranging and aligning the elements used of the mirror assembly.

Generally, in the scope of the present invention, a location on the surface of the source, from which a reflected laser beam originates is called an originating spot. Likewise, a location on the surface of the source, on which a laser beam reflected by elements of the mirror assembly impinges onto the surface of the source, is called a destination spot.

In embodiments with more than one source, the respective originating spot and the respective destination spot can be located at the same source or at different sources. In embodiments with a source providing more than one material, the respective originating spot and the respective destination spot can be located at the same material or different materials of said source.

Alternatively, or additionally, the laser system according to the present invention can be characterized in that the mirror assembly comprises one or more pairs of mirrors each comprising first mirrors and a second mirrors for reflecting the reflected laser beam reflected on an originating spot on the surface of the source back towards a destination spot on the surface of the source, wherein the first mirror reflects the laser beam towards the second mirror, and the second mirror reflects the laser beam towards the destination spot. According to this embodiment, the laser beam is internally reflected within the mirror assembly before it is reflected back towards the surface of the source. The increased requirements with respect to arrangement and/or alignment of two mirrors, the first and second mirror of the mirror pair, are balanced by increased possibilities with respect to positioning and/or shaping of the reflected laser beam. For example, with a pair of mirrors not only the destination spot can be freely chosen, but also an angle of the laser beam reflected back towards the surface of the source, both with respect to the surface and with respect to the reflected laser beam originating from the originating spot.

In the context of the present invention, the term "pair of mirrors" also includes a mirror arrangement in which further mirrors are arranged in the beam path of the laser beam between the first mirror and the second mirror forming the respective pair of mirrors.

Further, the laser system according to the present invention can comprise that the destination spot corresponds to the originating spot. Hence, also the laser beam reflected back onto the surface of the source impinges onto the same spot as it originates. As the absorbed energies of the laser beams impinging at said spot add up, the intended evaporation and/or sublimation process at exactly this position on the surface of the source can thereby be enhanced.

According to an alternative, or additional, embodiment, the laser system according to the present invention can also be characterized in that the destination spot is arranged on the surface of the source spaced apart to the originating spot. According to this embodiment, the laser beams impinge on different spots onto the surface of the source. The absorbed energy is spread over a larger area of the surface of the source. In particular, the energy absorbed at each of said different spots can be adjusted such that at each of said different spots the material of the source is evaporated and/or sublimated. Extensive and wide-area evaporation and/or sublimation can be achieved as a result.

Further, the laser system according to the present invention can comprise that the originating spot corresponds to the initial spot. It should be noted that the expression "initial spot" not only describes a position on the surface of the source, but also that the incoming laser beam is directly provided by the laser light source and the guidance means, respectively. In other words, the laser beam reflected on the surface of the source originates from the laser light source, and no previous back reflection by the mirror assembly took place.

Alternatively, or additionally, the laser system according to the present invention can also comprise that the originating spot corresponds to the destination spot of a previous back reflection of the laser beam provided by the mirror assembly. In other words, in this embodiment the laser beam reflected on the surface of the source originates already from a previous back reflection provided by the mirror assembly. An iteration of back reflections of the laser beam towards the surface of the source provided by the mirror assembly can thereby be provided, generally limited only by the number of individual mirrors and/or pairs of mirrors comprised by the mirror assembly. With each back reflection, the efficiency of the usage of the energy of the laser beam for the evaporation and/or sublimation process can be enhanced.

In particular with the above described embodiment comprising mirror pairs as part of the mirror assembly, also a back reflection of the reflected laser beam onto the initial spot can be provided, especially more than once. In this case, the initial spot and the originating spot and the destination spot are essentially identical.

According to another embodiment, the laser system according to the present invention can comprise that at least one of the one or more mirrors comprises a planar surface shape for an unaltered reflection of the laser beam. In the scope of the present invention, in an unaltered reflection of the laser beam essentially only the direction of the laser beam is changed. Mirrors with planar surface shapes are relatively cheap and can be provided easily. Also, simple metal surfaces can be used as such mirrors with planar surface shapes. The mirror assembly and hence also the laser system as a whole can be simplified.

Additionally, of alternatively, the laser system according to the present invention can be characterized in that at least one of the one or more mirrors comprises a curved surface shape for a focused reflection of the laser beam. With curved surface shapes, mirrors can also provide shaping and/or focusing and/or defocusing of the laser beam while reflecting. In particular, in many embodiments of evaporation system based on laser evaporation and/or sublimation, the laser beam is focused towards the source, either on a spot directly on the surface of the source or somewhere in between the laser light source and the source. By that, the laser beam reflected on the surface of the source is diverging. By using mirrors in the mirror assembly comprising curved surface shapes, said divergence of the reflected laser beam can be addressed and compensated, up to the point that the laser beam reflected back by the mirror assembly in turn is refocused towards the surface of the source. In addition, also the shape of the laser beam can be altered, for instance for providing a laser beam with an elliptic cross section resulting in a circular spot on the surface of the source.

According to a particular embodiment, the laser system according to the present invention can comprise that the first mirror and the second mirror of one of the one or more pairs of mirrors comprise respective surface shapes constructed for a focused reflection of the laser beam by the respective pair of mirrors. In this embodiment, a pair of mirrors of the mirror assembly is addressed. By providing in summary a focused reflection of the respective pair of mirrors, a size of the destination spot on the surface of the source can be minimized, preferably a point-like destination spot can be provided. This can be provided for instance by reflecting the laser beam already by the first mirror in a collimated way, whereby in this case the surface shape of the second mirror can be chosen curved for further focusing the laser beam or alternatively planar, if the collimation of the laser beam provided by the first mirror is sufficient. Alternatively, the first mirror can reflect the laser beam in an essentially parallel way, and the second mirror essentially provides the focusing of the laser beam. In this embodiment, the impact of a distance between the first mirror and the second mirror of the pair of mirrors can be minimized. The surface shape of the first mirror is adjusted to the shape of the incoming reflected laser beam. As mentioned above, in most of the cases the incoming reflected laser beam will be diverging, hence the surface shape of the first mirror will be chosen such that said divergence of the incoming reflected laser beam is at least compensated for an essentially parallel laser beam, or even changed into a convergence of a collimated laser beam. However, if the incoming reflected laser beam is already collimated or parallel, the first mirror can also comprise a planar surface shape.

Further, the laser system according to the present invention can be characterized in that at least one of the one or more mirrors comprises, preferably consists of, the material of the source. The mirrors of the mirror assembly have to be in line-of-sight to the source. Hence, also material of the source evaporated and/or sublimated can propagate towards said mirrors more or less unhindered and a deposition of said material onto the mirrors cannot be prohibited. By providing the mirrors comprising, preferably consisting of, the material of the source, the surface of the respective mirror does not change by said deposition. Therefore, a change in reflectivity by said deposition can be minimized and the need for replacing the mirrors can be reduced.

According to another embodiment, the laser system according to the present invention can comprise that the mirror assembly comprises temperature adjusting means for adjusting the temperature of at least one of the one or more mirrors. The reflectivity of a mirror is often temperature dependent. In addition, also the manner, uniformity and especially smoothness of a deposition of evaporated and/or sublimated material of the source mentioned above depends on the temperature of the surface the material is deposited onto. Hence, by actively adjusting the temperature of the mirrors a uniform operation of the mirror assembly with respect to reflectivity of the mirrors of the mirror assembly can be enhanced.

Especially, the laser system can be enhanced by that the temperature adjusting means comprise cooling means for cooling the at least one of the one or more mirrors. Even if the purpose of the mirrors of the mirror assembly is reflecting the laser beam, the reflectivity is less than 100% and hence also in the mirrors of the mirror assembly absorption takes place. Cooling means as part of the temperature adjusting means provide the ability to actively lower the temperature of the respective mirror, for instance by transporting away the absorbed laser energy. A constant temperature and hence a uniform operation of the mirror assembly can thereby be enhanced.

Further, the laser system according to the present invention can additionally comprise that the cooling means comprise cooling ducts for a flow of a coolant fluid, in particular water, arranged within a bulk of the at least one of the one or more mirrors and/or within a cooling block attached to the at least one of the one or more mirrors. A flow of coolant fluid is one of the most convenient ways of transporting away energy absorbed by a mirror. The energy absorbed in the bulk of the mirror is either directly transferred into the coolant fluid or first transferred to the cooling block and subsequently transferred into the coolant fluid. The cooling ducts allow a continuous flow of coolant fluid, whereby preferably the provided coolant fluid is kept at a constant temperature. Thereby a continuous cooling of the mirrors of the mirror assembly can be provided, and especially the mirrors can be kept at a constant temperature.

According to a further enhanced embodiment, in the laser system according to the present invention, the cooling ducts comprise connecting means, wherein in an assembled state of the evaporation system the connecting means are arranged outside of the reaction chamber. In other words, through the connecting means coolant fluid can be fed into the cooling ducts without opening the reaction chamber, and vice versa also be received back from the cooling ducts after absorbing excess energy from the mirrors. A continuous operation of the cooling means, and hence of the laser system according to the present invention, can thereby be provided.

Additionally, the laser system according to the present invention can also be characterized in that the temperature adjusting means comprise heating means for heating the at least one of the one or more mirrors. In some embodiments, also heating the mirrors can be useful for a uniform operation, for instance when an increased temperature of the mirror is suitable for a uniform and especially smooth deposition of evaporated and/or sublimated material onto the surface of the mirrors. Preferably, the heating means can also comprise some heating ducts analogous to the cooling ducts for a flow of heating fluid, again in the bulk of the mirror or within a heating block attached to the at least one of the one or more mirrors, wherein the heating ducts, especially their connecting means, are accessible from outside of the reaction chamber. Especially preferred, the cooling means can also be used for heating, for instance by heating the coolant fluid flowing through the cooling ducts.

In another embodiment, the laser system according to the present invention can comprise that the mirror assembly comprises a beam dump arranged in the path of the last reflected laser beam reflected on the surface of the source. After the laser reflection of the laser beam at the surface of the source, in particular at the destination spot of the laser individual mirror or the laser pair of mirrors, respectively, of the mirror assembly, the reflected laser beam impinges somewhere within the reaction chamber. By providing a beam dump arranged in the path of the last reflected laser beam, said laser beam can be absorbed in a controlled way by the beam dump. Harm and possible damage to the reaction chamber or to the equipment arranged within the reaction chamber can thereby be avoided.

The laser system according to the present invention can be enhanced further by that the beam dump comprises a sensor, preferably a position-sensitive sensor, for measuring properties of the reflected laser beam impinging on the beam dump. As the properties of the laser beam, the source and the mirror assembly are known or at least essentially known, information is present about the expected properties of said last reflected laser beam. Such properties can be for instance power, power density, position, direction and/or shape of the laser beam. By implementing a suitable sensor in the beam dump, said properties can be measured at least partly. In particular, a position-sensitive sensor in the beam dump can be used for detecting misalignments of the laser beam. Preferably, said measurements are used for a closed-loop control of the laser light source and especially the mirror assembly, for a continuous and stable operation of the laser system according to the present invention.

According to the second aspect of the invention, the object can be satisfied by an evaporation system for coating a substrate with evaporated and/or sublimated material of a source, comprising a reaction chamber with a reaction volume for arranging the source and the substrate, and a laser system for evaporating and/or sublimating the material of the source. The evaporation system according to the second aspect of the present invention is characterized in that the laser system is constructed according to the first aspect of the present invention. Hence, the evaporation system according to the second aspect of the present invention provides all advantages described above with respect to the laser system according to the first aspect of the present invention.

Figure 4:
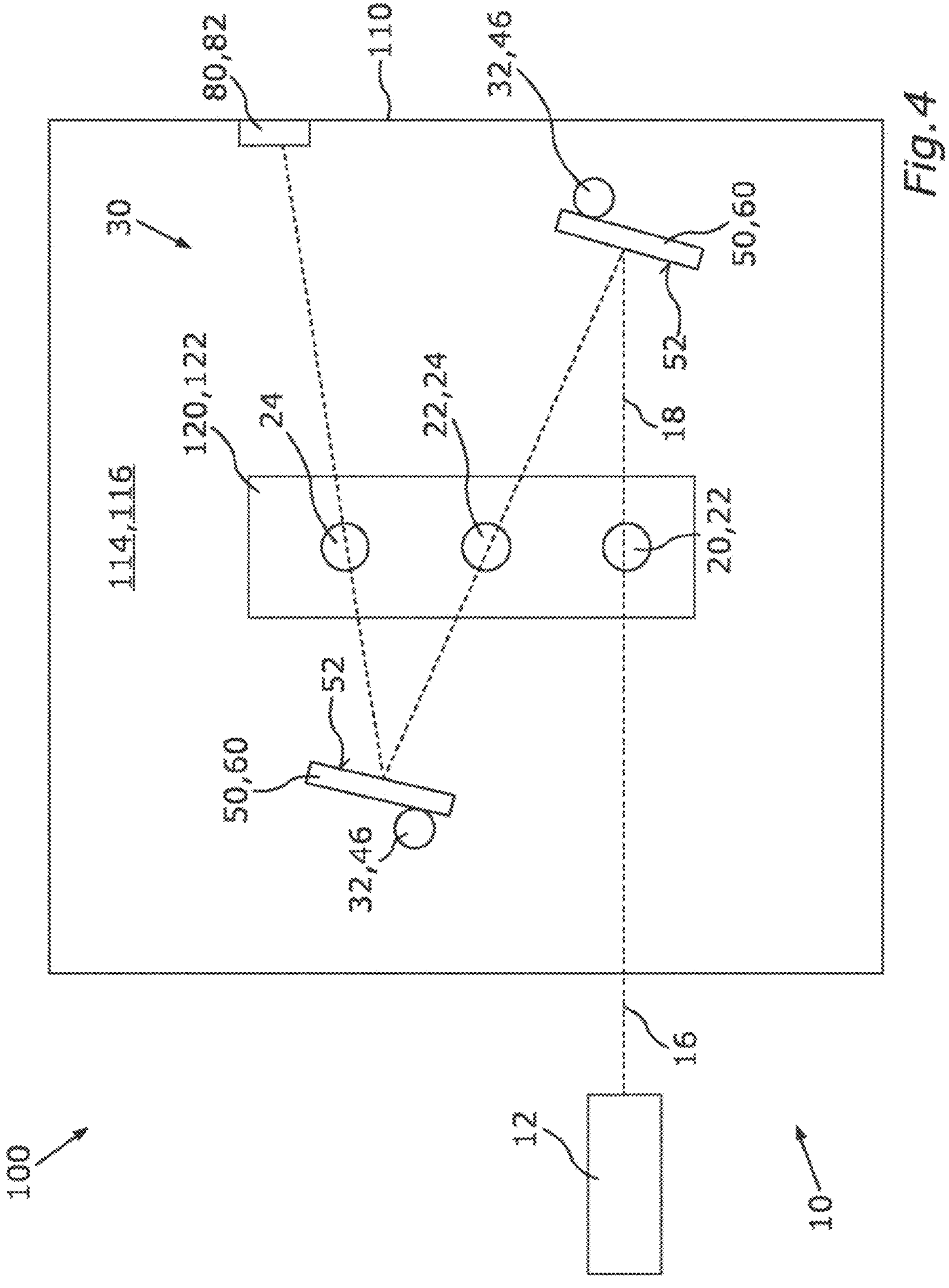
Figure 5:
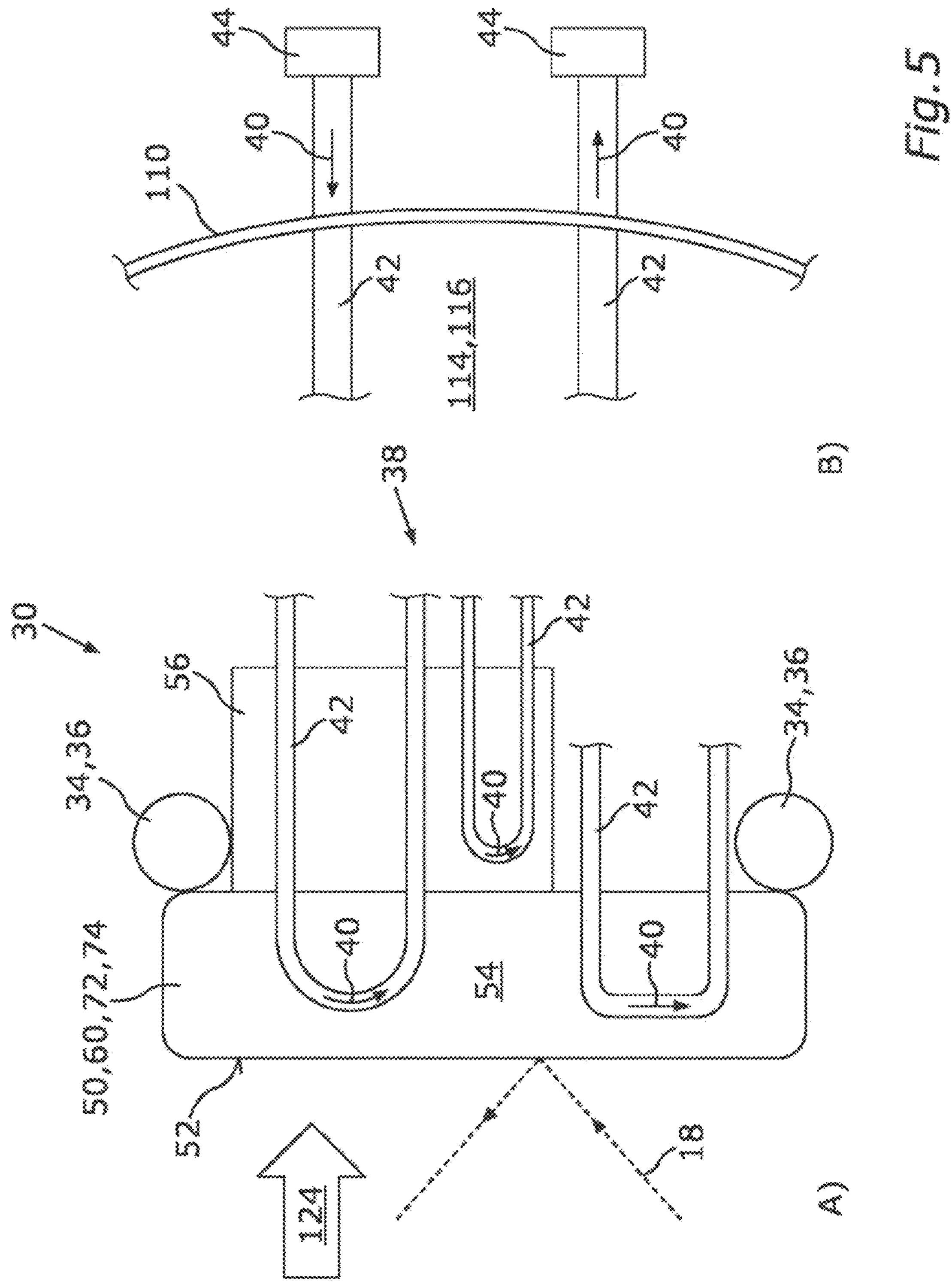

The invention will be explained in detail in the following by means of embodiments and with reference to the drawings in which are shown:

FIG. 1 An evaporation system according to the state of the art,

FIG. 2A first embodiment of the evaporation system according to the present invention, FIG. 3A second embodiment of the evaporation system according to the present invention, FIG. 4A third embodiment of the evaporation system according to the present invention, and FIG. 5 Temperature adjusting means for the mirror.

FIG. 2 shows a basic embodiment of the evaporation system 100 according to the present invention in a simplified schematic side view. A laser system 10 according to the present invention is used for evaporation and/or sublimation of material 124 of a source 120 arranged within a reaction chamber 110 of the evaporation system 100. The evaporated and/or sublimated material 124, depicted as elongated cloud above the surface 122 of the source 120, is deposited onto a substrate 130 likewise arranged within the reaction chamber 110. In particular, the reaction chamber 110 encloses a reaction volume 114 sealed against the surrounding and filled with a reaction atmosphere 116 suitable for the intended coating of the substrate 130. The reaction atmosphere can be a vacuum as low as $10^{-10}$ hPa or lower, or a reaction gas including but are not limited to oxygen, ozone, nitrogen, methane, ammonia, sulfuric or selenic gases.

In the depicted embodiment, the laser system 10 comprises a laser light source 12 arranged outside of the reaction chamber 110. Hence, the laser beam 16 is coupled into the reaction volume 114 by suitable coupling means, for instance by a chamber window 112. A guidance means 14 is used for providing the laser beam at an initial spot 20 at the surface 122 of the source 120. Said guidance means 14 can comprise all types of optical elements such as mirrors, lenses, axicons, or apertures, respectively. As depicted, the guidance means 14 can be arranged within the reaction chamber 110. Alternatively, and not depicted, also embodiments of evaporation systems 100 with the guidance means 14 outside of the reaction chamber 110, or even a split guidance means 14 partly arranged inside and partly arranged outside of the reaction chamber 110 are possible.

As mentioned above, the laser beam 16 impinging onto the surface 122 of the source 120 is used for evaporating and/or sublimating material 124 of the source 120. However, only a fraction of the incoming laser beam 16 is absorbed by the source 120 and the remaining part of the laser beam 16 is reflected as reflected laser beam 18. For most of the materials 120 used in evaporation systems, the reflectivity R is between 0.5 and 0.9. In other words, only 50% to 10% of the power of the laser beam 16 is used for the evaporation and/or sublimation process.

For solving this problem and in particular for enhancing an overall efficiency of the evaporation system 100 according to the present invention, the laser system 10 according to the present invention comprises a mirror assembly 30 for reflecting the reflected laser beam 18 back towards the surface 122 of the source 120. Said mirror assembly 30 comprises one or more mirrors 50, in the most basic embodiment depicted in FIG. 2 one single individual mirror 60. Said individual mirror 60, and in general all said mirrors 50, preferably are mounted on arrangement means 32 for arranging and positioning the mirrors within the reaction volume 114. Alignment means 46 can be used to, preferably even remotely, align the mirrors 50. By providing mirrors 50 comprising, preferably consisting of, the material 124 of the source 120, long term stability of the reflectivity of the mirrors 50 can be provided, as material 124 deposited onto the mirrors 50 essentially has no effect with respect to the reflectivity of the mirrors 50.

A reflected laser beam 18 originating from an originating spot 22 on the surface 122 of the source 120 impinges onto the individual mirror 60 and is reflected back towards a destination spot 24 on the surface 122 of the source 120. As the incoming laser beam 16 is parallel in the simple example shown in FIG. 2, a planar surface shape 52 can be used for the individual mirror 60. Further, In the depicted embodiment of FIG. 2, the initial spot 20, the originating spot 22 and the destination spot 24 are identical.

In summary, said back reflection of the reflected laser beam 16 enhances the efficiency of the laser system 10 and hence of the evaporation system 100. The initially impinging laser beam 16 is reflected (with reflectivity R) on the surface 122 and hence absorbed only partially (1−R). The reflected laser beam 18 is again reflected on the individual mirror 60 (R) and successively again absorbed only partially (1−R) on the surface 122 of the source. In total, the fraction of the power P of the initial laser beam 16 rises from (1−R)*P to (1−R)*P+R*R*(1−R)*P, or with R=0.9 from 0.1*P to 0.181*P.

However, FIG. 2 also shows the drawback of this most basic embodiment of the laser system 10 according to the present invention. The reflected laser beam 18 reflected back by the mirror assembly 30 propagates on essentially the same path as the initial laser beam 16. In other words, the reflected laser beam 18 is reflected again at the surface 122 of the source 120 towards the laser light source 12, which might destabilize and/or even harm the laser light source 12.

Figure 3:
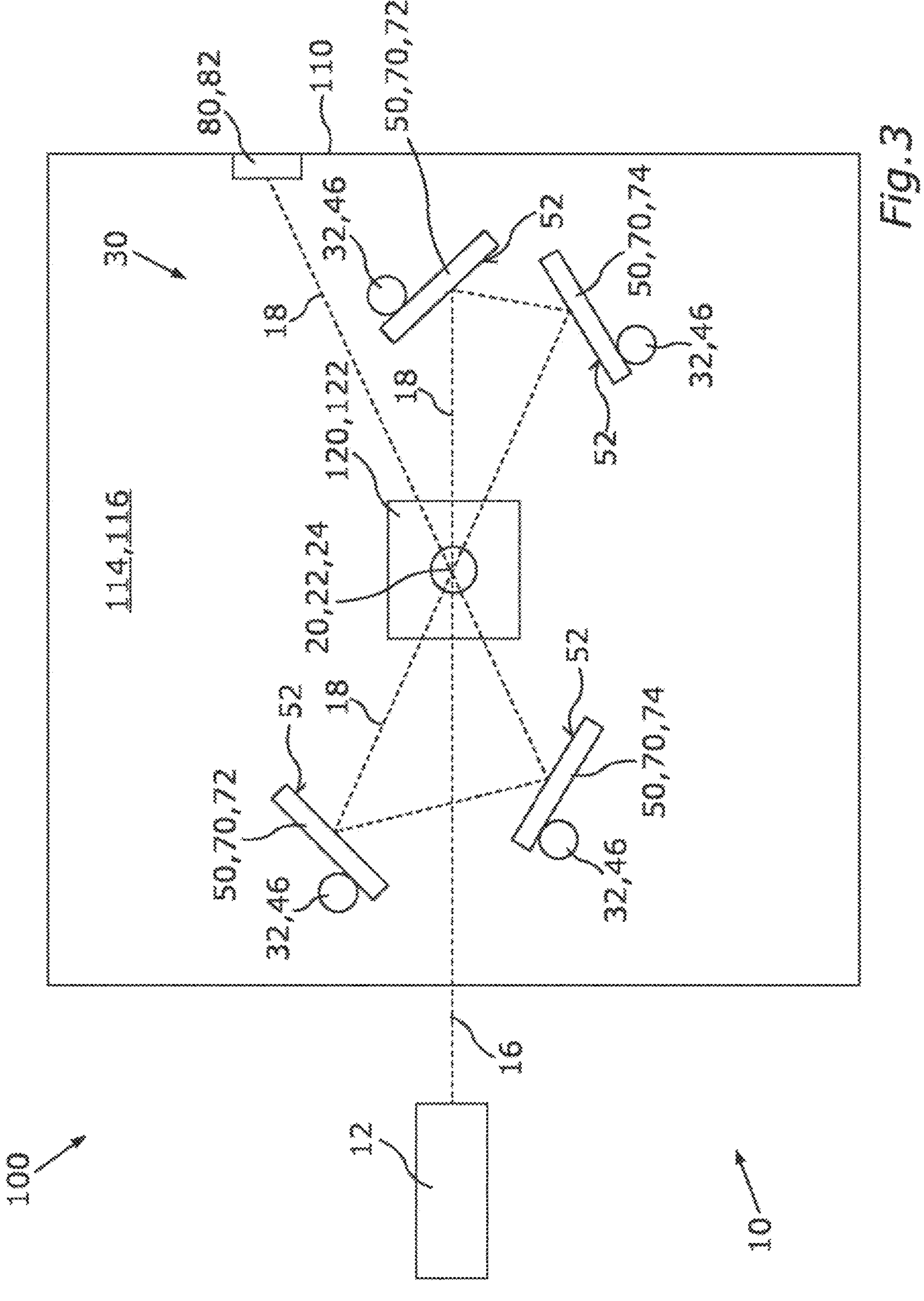

A possibility of an enhanced embodiment of the laser system 10 according to the present invention, and hence of the evaporation system 100 according to the present invention, which avoids the aforementioned drawback is shown in FIG. 3 in a simplified schematic top view. Again, the evaporation system 100 comprises a reaction chamber 110 enclosing a reaction volume 114 filled with a reaction atmosphere 116. The source 120 is arranged in the reaction chamber 110, the laser light source 12 outside of the reaction chamber 110. Other components, such as for instance a chamber window 112, a guidance means 14, and a substrate 130, are not shown, but nevertheless still present.

In this embodiment of FIG. 3, the mirror assembly 30 of the laser system 10 comprises four mirrors 50 grouped in two mirror pairs 70, each mirror pair 70 comprising a first mirror 72 and a second mirror 74. Again, the mirrors 50, 72, 74 are mounted within the reaction chamber 110 using arrangement means 32, whereas alignment means 46 are implemented as part of the arrangement means 32.

In contrast to an individual mirror 60 as used in the embodiment of FIG. 2, the first mirror 72 deflects the incoming reflected laser beam 18 towards the second mirror 74, and only the second mirror 74 reflects the reflected laser beam 18 again towards the surface 122 of the source 120. Preferably, in total the pair of mirrors 70 reflects the incoming reflected laser beam 18 in a focused way. In the embodiment depicted in FIG. 3, each first mirror 72 comprises a surface shape 52 constructed to reflect the laser beam 16 essentially parallel to the second mirror 74, and the second mirror 74 comprises a curved surface shape 52 for a focused reflection of the laser beam 16. In other, not depicted embodiments, also different surface shapes 52 of the first mirror 72 and the second mirror 74 of the respective pair of mirrors 70 are possible, for instance the first mirror 72 can comprise a surface shape 52 constructed to provide already the necessary collimation of the incoming reflected laser beam 18 and the second mirror 74 consequently comprises a planar surface shape 52.

Hence, as clearly visible in FIG. 3, also the embodiment of the laser system 10 of FIG. 3 is enabled to reflect the reflected laser beam 18 towards the same position on the surface 122. In other words, also in this embodiment the initial spot 20 of the initial laser beam 16 from the laser light source 12, the originating spot 22, from which each of the mirror pairs 70 receive the respective reflected laser beam 18, and the destination spot 24, towards each of the mirror pairs 70 direct the respective reflected laser beam 18, are identical. However, by the implementation of the mirror pairs 70, the direction of the reflected laser beam 18 coming from the respective second mirror 74 is different from the direction of the reflected laser beam 18 coming from the respective originating spot 22 on the surface 122 of the source 120. A reflection of the reflected laser beam 18 back towards the laser light source can thereby be avoided.

In addition, the last reflected laser beam 18 can be used for laser beam diagnostics. For this purpose, a beam dump 80 is arranged in the path of the laser reflected laser beam 18, wherein the beam dump 80 is equipped with a sensor, preferably a position-sensitive sensor 82, for detecting the reflected laser beam 18. The measurements of the sensor can for instance be used for a closed-loop control of the laser system 10, in particular by addressing actuators of the arrangement means 32 or of the alignment means 46.

By using two mirror pairs 70, the efficiency of the laser system 10 and hence of the evaporation system 100 can be enhanced further. Except for the first absorption, each absorption is preceded by additional three reflections of the laser beam 16, 18: on the source 120, on the first mirror 72 and on the second mirror 74, respectively, of the actual mirror pair 70. Following the considerations made with respect to FIG. 2, the total fraction of absorbed laser power adds up to $$(1-R)^* P(\text{initial laser beam } 16) + (R^* R^* R)^* (1-R)^* P(\text{after first mirror pair } 70) + (R^* R^* R)^* (R^* R^* R)^* (1-R)^* P(\text{after second mirror pair } 70)$$

With a reflectivity of 0.9, after the first mirror pair 70 the efficiency rises from 0.1 to about 0.173, after the second mirror pair 70 to about 0.226. Each additional mirror pair 70 would add another fraction of absorbed laser power, again multiplied by R*R*R. For example, by using ten mirror pairs 70, the efficiency can be enhanced by a factor of about 3.5.

For pairs of mirrors with additional mirrors between the first mirror and the second mirror, an additional factor (1−R) has to be inserted in the formula above of the respective pair of mirrors for each of the additional mirrors.

FIG. 4 depicts an alternative embodiment of the evaporation system 100 according to the present invention and especially of the laser system 10 according to the present invention in a simplified schematic top view, in which the drawback described with respect to FIG. 2 can be avoided. Again, the evaporation system 100 comprises a reaction chamber 110 enclosing a reaction volume 114 filled with a reaction atmosphere 116. The source 120 is arranged in the reaction chamber 110, the laser light source 12 outside of the reaction chamber 110. Other components, such as for instance a chamber window 112, a guidance means 14, and a substrate 130, are not shown, but nevertheless still present.

However, in this embodiment, similar to FIG. 2 the mirror assembly comprises individual mirrors 60. Again, the mirrors 50, 60 are mounted within the reaction chamber 110 using arrangement means 32, whereas alignment means 46 are implemented as part of the arrangement means 32.

For avoiding reflecting back the reflected laser beam 18 towards the laser light source 12, in this embodiment the destination spots 24 of each of the individual mirrors 60 are arranged on the surface 122 of the source 120 spaced apart to the respective originating spot 22. By this, the reflected laser beams 18 reflected on the mirrors 50, 60 of the mirror assembly automatically comprise a different direction with respect to the reflected laser beams 18 impinging onto the mirrors 50, 60. By providing different destination spots 24 on the surface 122 of the source 120, a larger area of the surface 122 of the source 120 can be used for the evaporation and/or sublimation process.

A beam dump 80 arranged in the path of the laser reflected laser beam 18, and in particular a sensor 82 arranged in this beam dump 80, can again be used for laser beam diagnostics. Also, according to this embodiment, the measurements of the sensor can for instance be used for a closed-loop control of the laser system 10, in particular by addressing actuators of the arrangement means 32 or of the alignment means 46.

Also, by using two individual mirrors 60, the efficiency of the laser system 10 and hence of the evaporation system 100 can be enhanced. Except for the first absorption, each absorption is preceded by two additional reflections of the laser beam 16, 18: one on the source 120 and one on the respective individual mirror, respectively. Following the considerations made with respect to FIG. 2 and FIG. 3, the total fraction of absorbed laser power adds up to $$(1-R)^{*}P(\text{initial laser beam 16}) + (R^{*}R)^{*}(1-R)^{*}P(\text{after first individual mirror 60}) + (R^{*}R)^{*}(R^{*}R)^{*}(1-R)^{*}P(\text{after second individual mirror 60})$$

With a reflectivity of 0.9, after the first individual mirror 60 the efficiency rises from 0.1 to about 0.181, after the second individual mirror 60 to about 0.247. Each additional mirror pair 70 would add another fraction of absorbed laser power, again multiplied by R*R*R. For example, when using ten mirror pairs 70, the efficiency can be enhanced by a factor of about 4.7.

With respect to FIGS. 3 and 4, embodiments of the mirror assembly 30 are described comprising either mirror pairs 70 or individual mirrors 60, respectively. However, also embodiments comprising both mirror pairs 70 and individual mirrors 60 as part of the respective mirror assembly 30 are possible.

As mentioned above, also the mirrors 50, 60, 72, 74 of the mirror assembly 30 reflect the reflected laser beam 18 with a reflectivity R smaller than 1. Hence, a fraction of the laser power of the reflected laser beam 18 is also absorbed by the mirrors 50, 60, 72, 74. For compensating the absorbed laser power, the mirror assembly 30 can comprise temperature adjusting means 34 as schematically depicted in panels A, B of FIG. 5. Panel A depicts a mirror 50, 60, 72, 74, panel B depicts a wall of the reaction chamber 110 comprising parts of the temperature adjusting means 34.

As shown in panel A of FIG. 5, said temperature adjusting means 34 can in particular comprise cooling means 38 for the above-mentioned task of compensating the absorbed laser power. Cooling ducts 42 within a bulk 54 of the mirror and/or within a cooling block 56 attached to the bulk 54 of the mirror 50, 60, 72, 74 allow the flow of a coolant fluid 40. The absorbed excess energy is transferred from the mirror 50, 60, 72, 74 to the coolant fluid 40. Thereby, cooling the mirror 50, 60, 72, 74 can be provided.

Preferably, the cooling ducts 42 comprise connecting means 44, which are accessible from outside of the reaction chamber 110. This is schematically depicted in panel B of FIG. 5. Opening the reaction chamber 110, and hence loosing the present reaction atmosphere 116 in the reaction volume 114, can thereby be avoided. A continuous operation of the cooling means 38 is thereby possible.

Another aspect addressed by the temperature adjusting means 34 is the possible, and in most of the cases unavoidable, deposition of material 124 of the source 120 (see FIG. 2, 3, 4) onto the mirror 50, 60, 72, 74. For providing a uniform and especially smooth deposition of evaporated and/or sublimated material 124, the temperature of the mirror 50, 60, 72, 74 can be raised, in other words, the mirror 50, 60, 72, 74 can be heated by the heating means 36. If the heating of the mirror 50, 60, 72, 74 by the absorbed fraction of the power of the reflected laser beam 18 is already exceeding the required amount, also a respective cooling of the mirror 50, 60, 72, 74 by the cooling means 38 of the temperature adjusting means 34 is possible.

LIST OF REFERENCES

10 Laser system
12 Laser light source
14 Guidance means
16 Laser beam
18 Reflected laser beam
20 Initial spot
22 Originating spot
24 Destination spot
30 Mirror assembly
32 Arrangement means
34 Temperature adjusting means
36 Heating means
38 Cooling means
40 Coolant fluid
42 Cooling ducts
44 Connecting means
46 Alignment means
50 Mirror
52 Surface shape
54 Bulk
56 Cooling block
60 Individual mirror
70 Pair of mirrors
72 First mirror
74 Second mirror 74
80 Beam dump
82 Sensor
100 Evaporation system
110 Reaction chamber
112 Chamber window
114 Reaction volume

116 Reaction atmosphere
120 Source
122 Surface
124 Material
130 Substrate

The invention claimed is:

1. Laser system for evaporating and/or sublimating a material of a source located in a reaction chamber of an evaporation system, the laser system comprising a laser light source for providing a laser beam and a guidance means for guiding the laser beam towards an initial spot on a surface of the source, wherein the laser system comprises a mirror assembly with one or more mirrors for reflecting a reflected laser beam reflected at the surface of the source back towards the surface of the source.

2. Laser system according to claim 1,
wherein the mirror assembly comprises arrangement means for arranging the one or more mirrors within the reaction chamber.

3. Laser system according to claim 2,
wherein the arrangement means comprise alignment means for changing a direction of the reflected laser beam reflected on the one or more mirrors.

4. Laser system according to claim 1,
wherein the mirror assembly comprises one or more individual mirrors for directly reflecting the reflected laser beam reflected on an originating spot on the surface of the source back towards a destination spot on the surface of the source.

5. Laser system according to claim 1,
wherein the mirror assembly comprises one or more pairs of mirrors each comprising a first mirror and a second mirror for reflecting the reflected laser beam reflected on an originating spot on the surface of the source back towards a destination spot on the surface of the source, wherein the first mirror reflects the laser beam towards the second mirror, and the second mirror reflects the laser beam towards the destination spot.

6. Laser system according to claim 4,
wherein the destination spot corresponds to the originating spot.

7. Laser system according to claim 4,
wherein the destination spot is arranged on the surface of the source spaced apart to the originating spot.

8. Laser system according to claim 4,
wherein the originating spot corresponds to the initial spot.

9. Laser system according to claim 4,
wherein the originating spot corresponds to the destination spot of a previous back reflection of the laser beam provided by the mirror assembly.

10. Laser system according to claim 1,
wherein at least one of the one or more mirrors comprises a planar surface shape for an unaltered reflection of the laser beam.

11. Laser system according to claim 1,
wherein at least one of the one or more mirrors comprises a curved surface shape for a focused reflection of the laser beam.

12. Laser system according to claim 5,
wherein at least one of the one or more mirrors comprises a curved surface shape for a focused reflection of the laser beam and
wherein the first mirror and the second mirror of one of the one or more pairs of mirrors comprise respective surface shapes constructed for a focused reflection of the laser beam by the respective pair of mirrors.

13. Laser system according to claim 1,
wherein at least one of the one or more mirrors comprises the material of the source.

14. Laser system according to claim 1,
wherein the mirror assembly comprises temperature adjusting means for adjusting the temperature of at least one of the one or more mirrors.

15. Laser system according to claim 14,
wherein the temperature adjusting means comprise cooling means for cooling the at least one of the one or more mirrors.

16. Laser system according to claim 15,
wherein the cooling means comprise cooling ducts for a flow of a coolant fluid arranged within a bulk of the at least one of the one or more mirrors and/or within a cooling block attached to the at least one of the one or more mirrors.

17. Laser system according to claim 16,
wherein the cooling ducts comprise connecting means, wherein in an assembled state of the evaporation system the connecting means are arranged outside of the reaction chamber.

18. Laser system according to claim 14,
wherein the temperature adjusting means comprise heating means for heating the at least one of the one or more mirrors.

19. Laser system according to claim 1,
wherein the mirror assembly comprises a beam dump arranged in the path of the last reflected laser beam reflected on the surface of the source.

20. Laser system according to claim 19,
wherein the beam dump comprises a sensor for measuring properties of the reflected laser beam impinging on the beam dump.

21. Evaporation system for coating a substrate with evaporated and/or sublimated material of a source, comprising a reaction chamber with a reaction volume for arranging the source and the substrate, and a laser system for evaporating and/or sublimating the material of the source,
wherein the laser system comprises a laser light source for providing a laser beam and a guidance means for guiding the laser beam towards an initial spot on a surface of the source,
wherein the laser system comprises a mirror assembly with one or more mirrors for reflecting a reflected laser beam reflected at the surface of the source back towards the surface of the source.

* * * * *